United States Patent [19]

Kishi

[11] 4,066,845
[45] Jan. 3, 1978

[54] PULSIVE NOISE REMOVING APPARATUS FOR AN FM RECEIVER

[75] Inventor: Hiroyasu Kishi, Gunma, Japan

[73] Assignees: Sanyo Electric Co., Ltd.; Tokyo Sanyo Electric Co. Ltd., both of Moriguchi, Japan

[21] Appl. No.: 756,850

[22] Filed: Jan. 5, 1977

[30] Foreign Application Priority Data

Mar. 19, 1976 Japan .................. 51-31631

[51] Int. Cl.² ............................................. H04H 5/00
[52] U.S. Cl. ................................ 179/15 BT; 325/478
[58] Field of Search ............. 179/15 BT; 325/36, 402, 325/403, 478

[56] References Cited

U.S. PATENT DOCUMENTS

| | | | |
|---|---|---|---|
| 3,573,382 | 4/1971 | Feit .................. | 179/15 BT |
| 3,739,285 | 6/1973 | Hepp ................. | 179/15 BT |
| 3,978,412 | 8/1976 | Frerking .............. | 325/478 |
| 3,983,488 | 9/1976 | Bush et al. .......... | 325/478 |
| 3,995,220 | 11/1976 | Hansen ................ | 325/478 |

*Primary Examiner*—Douglas W. Olms
*Attorney, Agent, or Firm*—Darby & Darby

[57] ABSTRACT

An apparatus for removing a pulsive noise in an FM stereo signal including a stereo information signal and a stereo pilot signal, said composite signal further including a pulsive noise, said apparatus comprising an FM detector for providing said composite signal, a noise detector for detecting said pulsive noise for providing a control signal of a predetermined pulse width upon occurrence of said noise, a gate circuit to be normally closed for passing therethrough said composite signal and to be opened by the output from the noise detector, an amplifier for amplifying the output from the gate, a frequency band cut off filter coupled to said amplifier to form a negative feedback circuit, said filter being set to the pilot signal frequency and/or the subcarrier signal frequency, an attenuator coupled to the output of said amplifier, and a capacitor coupled to the output of said gate circuit and cooperative with said attenuator for holding, when the gate is opened, the signal level at the output of the gate to the value immediately before the gate is opened, said amplifier, attenuator and the capacitor constituting a closed loop, said closed loop forming a positive feedback circuit with respect to said frequencies of the pilot signal and/or subcarrier signal, which serves as an oscillator when said gate is opened, thereby to provide a pseudo pilot and/or subcarrier signals.

6 Claims, 9 Drawing Figures

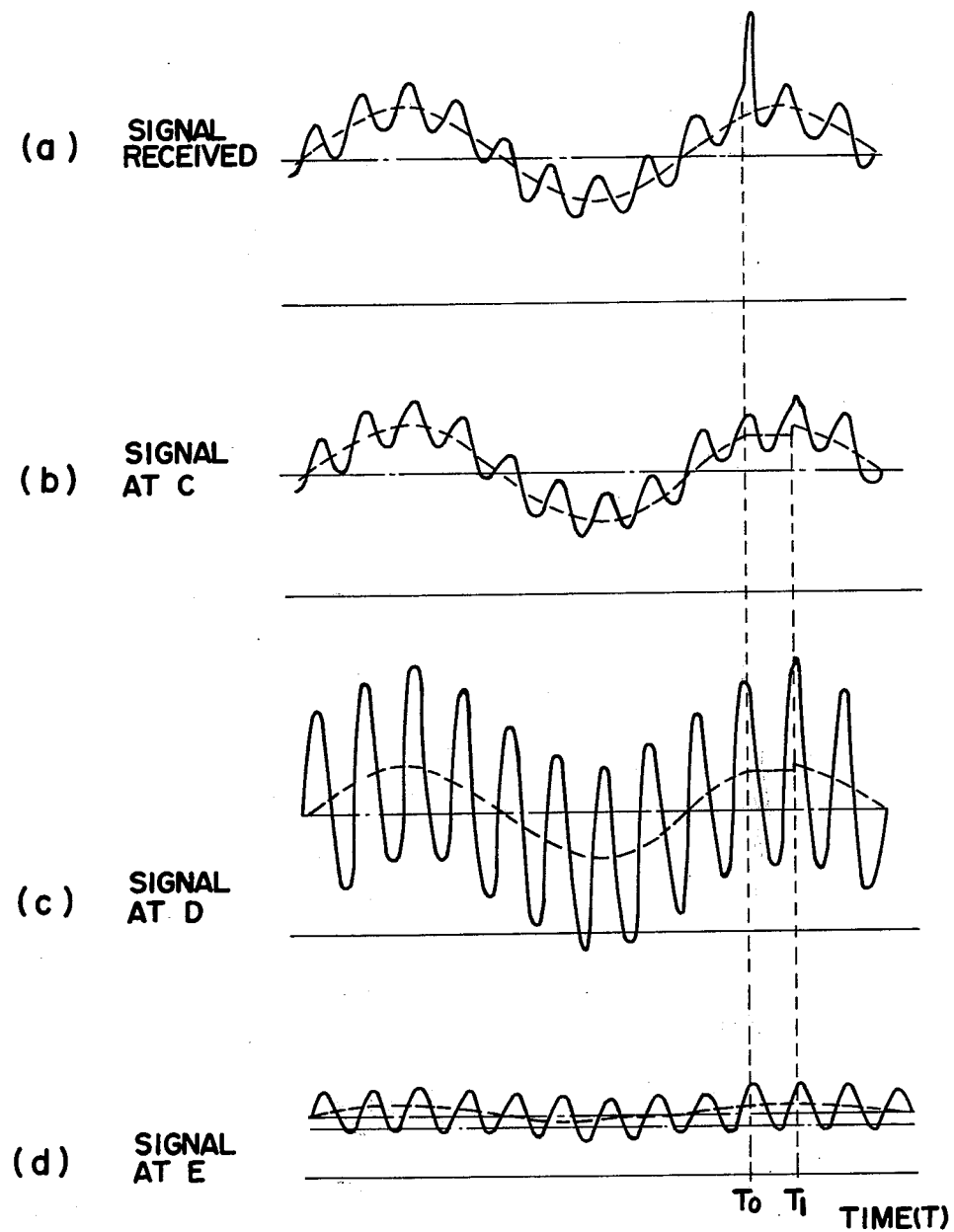

PULSIVE NOISE REMOVING APPARATUS FOR AN FM RECEIVER

BACKGROUND OF THE INVENTION

1. Field of the Invention

The present invention relates to an apparatus for removing a pulsive noise in an FM receiver. More specifically, the present invention relates to an apparatus for removing effectively a pulsive noise included in a received signal in an FM receiver.

2. Description of the Prior Art

It has been well known that a pulsive noise, such as an ignition noise caused by an automobile, interferes with normal reception by an FM receiver. Since such a pulsive noise tends to phase modulate the FM signal, it cannot be removed by an amplitude limiter and is liable to be detected by a detector and to be transferred to the subsequent stage. Accordingly, it is necessary that such a pulsive noise be removed in a signal transmission path in the stage subsequent to the detector.

Hitherto, two method for removing such a pulsive noise have been proposed and put in practical use. One method is to provide a gating circuit between the detector and a stereo multiplex circuit such that the gating circuit is opened on the occasion of occurrence of a noise, thereby to remove the noise. The other method is to provide gating circuits in the two output signal lines for left and right signals, respectively, from a stereo multiplex circuit, such that these gating circuits are opened on the occasion of occurrence of the noise, thereby to remove the noise. These two methods each have advantages, but nevertheless have disadvantages that a pulse cannot be completely removed.

Accordingly, the present invention is directed to an improvement in a prior art method wherein a gating circuit is provided between a detector and a stereo multiplex circuit in an attempt to remove noise in a thorough manner.

Before entering into description of the inventive noise removing apparatus, a brief description will be made of a typical prior art noise removing apparatus with reference to FIG. 1. Referring to FIG. 1, the reference numeral 1 denotes an input terminal where a detected output signal is applied, the reference numeral 2 denotes an input transistor, the reference numeral 3 denotes a gate adapted to be kept open for a predetermined time period after receipt of a pulsive noise, the reference numeral 4 denotes a holding capacitor, the reference numeral 5 denotes an output transistor, and reference numeral 6 denotes an output terminal. The gate 3 is closed while no pulsive noise exists, so that the detected output signal is transferred from the input terminal 1 through the input transistor 2, the gate 3 and the output transistor 5 to the output terminal 6. At that time, the holding capacitor 4 is kept charged by the detected output signal. If and when a pulsive noise is received, a noise detector (not shown) becomes operative to open the gate 3. Since the noise detector has been adapted to keep the gate 3 open for a predetermined time period upon detection of the noise, the output transistor 5 is kept supplied for that time period from the holding capacitor 4 with a signal of the signal level immediately before the gate 3 is opened. Thus, the pulsive noise is effectively removed and is not transferred to the subsequent stages.

However, such a noise removing apparatus has a disadvantage in that even the pilot signal is interrupted during the time period when the gate is opened. If the pilot signal is interrupted for a predetermined time period, the switching signal for the stereo multiplex circuit is not obtained in the subsequent stage. As a result, the stereo multiplex circuit is switched from the stereo operation to monaural operation. If and when the gate is closed, the stereo multiplex circuit is switched back from monaural operation to stereo operation. Such a noise removing apparatus suffers from the shortcomings that distortion and noise are caused at the time of such switching between the stereo and monaural operations. Another disadvantage is that while the gate is opened the output signal is retained in the pilot signal voltage and that state is demodulated by the stereo multiplex circuit, which causes a noise.

In order to solve the above described disadvantages, provision may be made wherein while the gate is opened the pilot signal is applied from a separate circuit. To that end, it has been proposed that an LC parallel resonance circuit is provided in series with the holding capacitor, whereby a pseudo pilot signal is supplied from the LC parallel resonance circuit during the time period when the gate is opened.

SUMMARY OF THE INVENTION

Therefore, a principal object of the present invention is to provide an improved apparatus for removing a pulsive noise wherein different means are provided for supplying a pseudo pilot signal during the time period when the gate is opened, which means is suited for implementation in the form of an integrated circuit.

An essential feature of the inventive pulsive noise removing apparatus is a provision of a combination of an amplifier and a frequency band cut off filter for the frequency of a reference signal included in an FM signal. Because of such a combination, only a reference signal of a predetermined frequency band can be selectively amplified. In general, a frequency band cut off filter of an abrupt characteristic can be obtained with ease. As a result, the desired frequency band can be made sufficiently narrow.

Briefly described, the present invention comprises an apparatus for removing a pulsive noise in an FM receiver, wherein a pulsive noise included in an FM signal is removed by opening a gate circuit for a predetermined time period after such a pulsive noise occurs in the FM signal, characterized in that said apparatus comprises an amplifier for selectively amplifying a signal component of a predetermined frequency band which is selected to be the frequency of the reference signal in the FM signal, an attenuator for attenuating the output signal from said amplifier at a rate commensurate with the gain of said amplifier, and a holding capacitor cooperating with said attenuator for holding the output signal level, when the said gate circuit is opened, to the value immediately before the said gate circuit is opened. A positive feedback circuit is formed for the said amplifier by the closed loop including the said attenuator and the said holding capacitor, whereby the said amplifier operates as an oscillator together with the said positive feedback circuit when the said gate circuit is opened, thereby to provide a pseudo reference signal of the said predetermined frequency band at the output terminal.

In a preferred embodiment of the present invention, the said amplifier is provided with a frequency band cut off filter for removing the signal component of the said pedetermined frequency band. Preferably, the said frequency band cut off filter is set to remove the pilot signal frequency in the FM stereo signal. Alternatively, the said frequency band cut off filter may be set to remove the subcarrier signal frequency of the FM stereo signal.

According to the inventive pulsive noise removing apparatus in an FM receiver, a reference signal such as a stereo pilot signal or a stereo subcarrier signal can be inserted effectively in a pseudo manner during the time period when the gate is opened.

An aspect of the present invention is that no resonance circuit is provided at all and hence no precise selection and adjustment of the values for components, such as a coil and a capacitor, for the resonance circuit is necessary, inasmuch as a desired oscillator can be implemented and operated by simply adjusting the gain of the amplifier and the attenuation of the attenuator.

Another aspect of the present invention is that the inventive apparatus can be implemented with ease in the form of an integrated circuit and therefore can be applied to any types of FM receiver as well as an FM radio receiver where effective removal of a pulsive noise is desired.

These objects and other objects, features, aspects and advantages of the present invention will become more apparent from the following detailed description of the present invention when taken in conjunction with the accompanying drawings.

BRIEF DESCRIPTION OF THE DRAWINGS

FIG. 3, comprised of a-d shows waveforms of the signals at various portions in the FIG. 2 diagram for explaining the operation of the FIG. 2 diagram;

Figure 1:
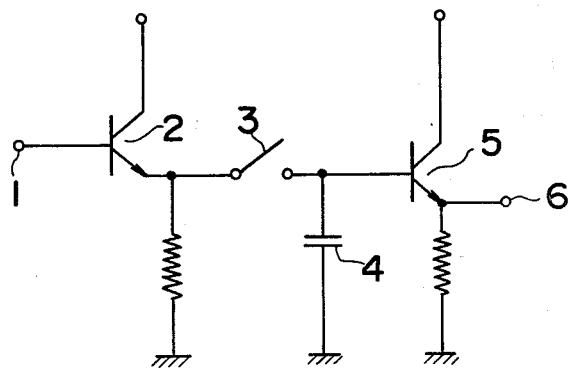
FIG. 1 is a schematic diagram of a conventional pulsive noise removing apparatus.
Figure 2:
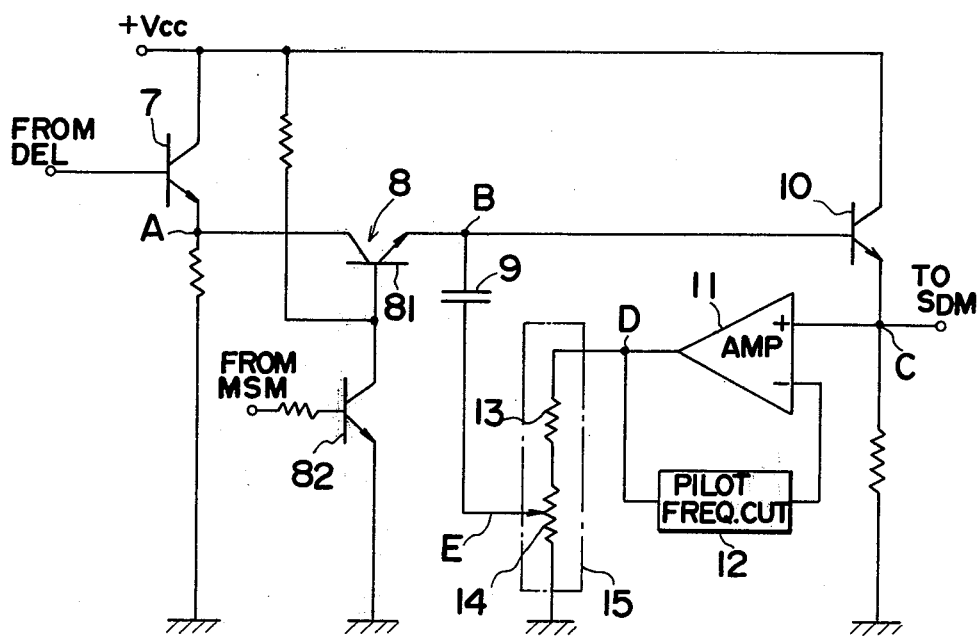
FIG. 2 is a schematic diagram of one embodiment of the inventive pulsive noise removing apparatus.
Figure 2A:
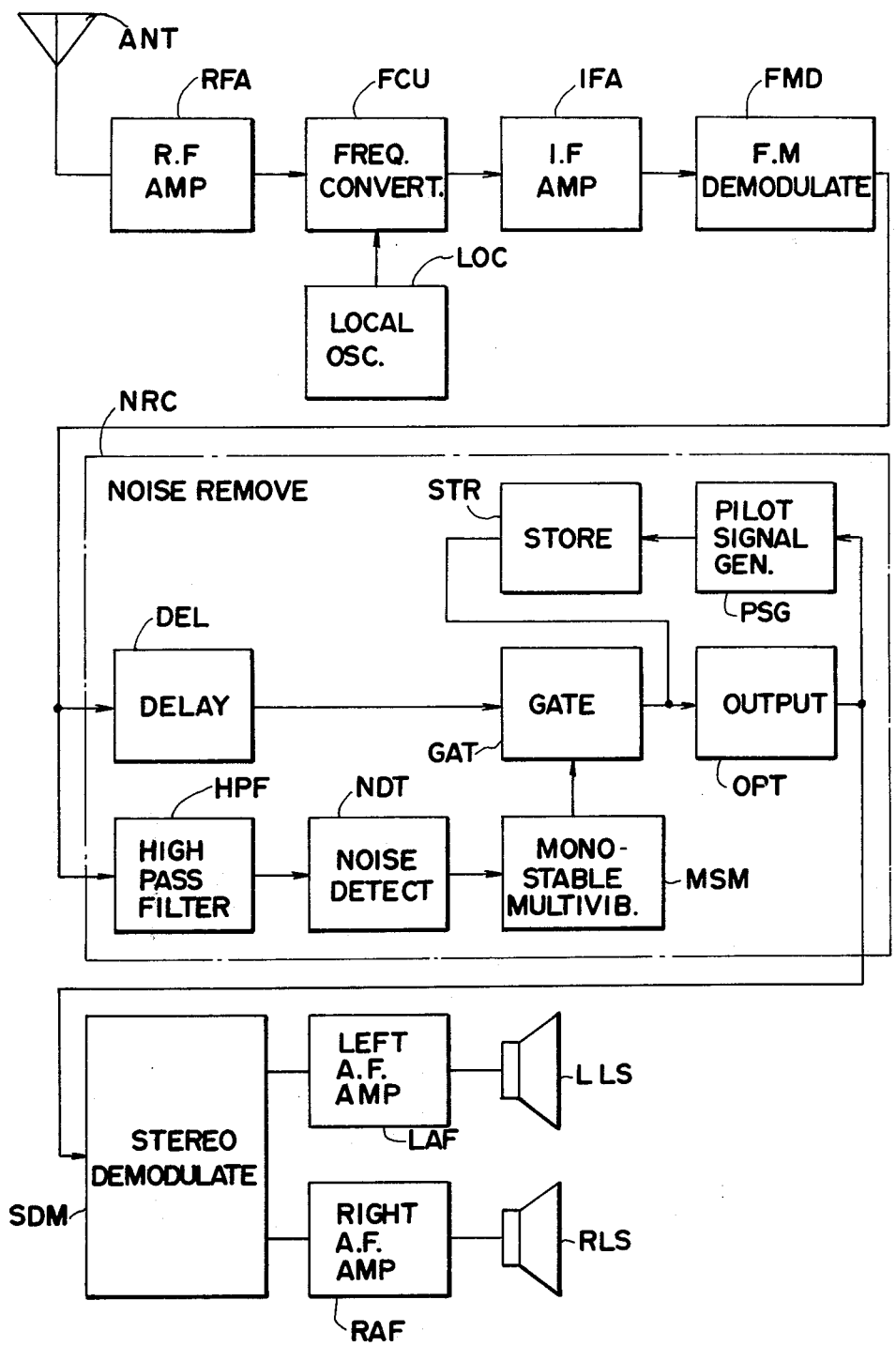
FIG. 2A shows a block diagram of a typical FM radio receiver employing a noise removing apparatus, where the present invention can be advantgeously employed.

DESCRIPTION OF THE PREFERRED EMBODIMENTS:

Referring to FIG. 2A, there is shown a block diagram of an FM radio receiver employing a typical noise removing apparatus where the present invention can be advantageously employed. Referring to FIG. 2A, the FM radio receiver shown comprises an antenna ANT for receiving a broadast FM signal wave, a radio frequency amplifier RFA for amplifying the FM signal received by the antenna ANT, a local oscillator LOC for generating a local oscillation signal for the purpose of frequency conversion, a frequency converter FCV for mixing the amplified FM signal from the radio frequency amplifier RFA with the local oscillation signal for converting the frequency of the FM signal into an intermediate frequency, an intermediate frequency amplifier IFA for amplifying the intermediate frequency signal from the frequency converter FCV, an FM detector FMD for demodulating the intermediate frequency signal into the original low frequency signal, a stereo demodulating circuit SDM for demodulating the low frequency signal from the FM detector FMD into the original stereo signal, left and right audio frequency amplifiers LAF and RAF for amplifying the demodulated stereo left and right signals, and left and right loud speakers LLS and RLS for converting the amplified left and right audio frequency signals into the left and right sounds. Detailed structure and operation of the respective blocks are well known to those skilled in the art. Hence, it is not believed necessary to describe the same here in more detail.

Referring again to FIG. 2A, in the FM radio receiver shown, the output from the FM detector FMD is applied through a noise removing circuit NRC to the stereo demodulating circuit SDM. The noise removing circuit NRC basically comprises a delay circuit DEL for delaying the output from the FM detector FMD, a gate circuit GAT to be gated so as to remove the noise component from the delayed output from the delay circuit DEL, and an output circuit OPT for supplying the gated output to the stereo demodulation circuit SDM. The output from the FM detector FMD is also applied to a high pass filter HPF, which is provided to withdraw only the high frequency pulse component from the output from the FM detector FMD which usually includes a high frequency pulse component as well as a normal low frequency signal. The output from the high pass filter HPF is applied to a noise detecting circuit NDT. The noise detecting circuit NDT may comprise a differential amplifier and serves to provide from the output signal from the high pass filter HPF a trigger signal, which is applied to a monostable multivibrator MSM. The monostable multivibrator MSM is responsive to the said trigger signal to be enabled to provide a rectangular pulse signal of a predetermined width, which is applied to the said gate circuit GAT for the purpose of on/off controlling the same as a function of the said rectangular pulse signal. The delay circuit DEL is provided to delay the output from the FM detector FMD such that the signals being transmitted through two signal transmission paths, i.e. the delay circuit DEL, and a series connection of the high pass filter HPF-noise detector NDT-monostable multivibrator MSM, from the FM detector FMD to the gate circuit GAT, are transmitted synchronously. The output from the output circuit OPT is applied to a pseudo pilot signal generator PSG to provide a pseudo pilot signal. The output from the pseudo pilot signal generator PSG is applied to a storing circuit STR. The output from the storing circuit STR is added to the output from the gate circuit GAT. It is pointed out that the present invention is directed to an improvement in the pseudo pilot signal generator PSG. Hence, the pseudo pilot signal generator PSG and the storing circuit STR will be described in more detail in conjunction with the embodiment of the present invention.

FIG. 2 is a schematic diagram of one embodiment of the inventive pulsive noise removing apparatus to be employed in an FM radio receiver. Referring to FIG. 2, the reference numeral 7 denotes an input transistor connected to the subsequent stage of the FM detector (not shown in FIG. 2), the reference numeral 8 denotes a gating circuit, the reference numeral 9 denotes a holding capacitor, the reference numeral 10 denotes an output transistor, the reference numeral 11 denotes an amplifier having the input thereto connected to the emitter electrode of the output transistor 10 and having a predetermined gain K, the reference numeral 12 denotes a frequency band cut off filter for constituting a negative feedback circuit of the said amplifier 11 and for removing the frequency component of 19KHz stereo pilot signal, the reference numeral 13 denotes a fixed resistor, and the reference numeral 14 denotes a variable resistor, the said fixed resistor 13 and the variable resistor 14 constituting an attenuating circuit 15 having an attenuation factor $1/K$ corresponding to the gain factor K of the amplifier 11, the sliding terminal of the said variable resister 14 being connected to the holding capacitor 9. The gating circuit 8 comprises a transistor 81 connected in series with the signal transmission path, i.e. between the emitter electrode A of the transistor 7 and the base electrode B of the transistor 10, and the base electrode of the transistor 81 is grounded through a switching transistor 82. The base electrode of the transistor 82 is connected to the output of the monostable multivibrator MSM in FIG. 2A.

In operation, let it be assumed that the signal as shown in FIG. 3(a) and expressed by the following equation is obtained from the emitter electrode of the input transistor 7, i.e. the point A.

$$S_A = V_O + \alpha\sin Lt + \beta\sin Pt \ldots \quad (1)$$

where $V_O$ is a direct current component, $\alpha\sin Lt$ is a low frequency signal component, and $\beta\sin Pt$ is a pilot signal component.

At the outset, description will be made of a case where no pulsive noise exists in the signal shown in FIG. 3(a). Insofar as no pulsive noise exists, the gate 8 is kept closed. Therefore, the points A and B are in the same signal level and the point C is at a signal level which is lower than the point A by the value $V_{be}$ (the base - emitter voltage of the transistor), as shown in FIG. 3(b) and expressed by the following equation.

$$S_C = V_O - V_{be} + \alpha\sin Lt + \beta\sin Pt \ldots \quad (2)$$

Assuming that the gain of the amplifier 11 is 10, only the pilot signal component is selectively amplified ten times, inasmuch as all the signal components other than the pilot signal component are negative fedback from the point D to the input of the amplifier 11 by means of the pilot signal frequency band cut off filter 12. Accordingly, the signal obtained at the point D may be shown as FIG. 3(c) and expressed by the following equation.

$$S_D = V_O - V_{be} + \alpha\sin Lt + 10\beta\sin Pt \ldots \quad (3)$$

The signal obtained at the point D is then attenuated by means of the attenuating circuit 15 to $1/K$, i.e. 1/10 and the attenuated output is withdrawn through the sliding terminal of the variable resistor 14, i.e. the point E. The signal at the point E may be shown as FIG. 3(d) and expressed by the following equation.

$$S_E = \frac{V_O - V_{be}}{10} + \frac{\alpha}{10}\sin Lt + \beta\sin Pt \quad (4)$$

The voltage across the holding capacitor 9 may be obtained as (the voltage at the point B) - (the voltage at the point E), i.e. may be expressed by the following equation.

$$S_A - S_E = \frac{9}{10}V_O + \frac{1}{10}V_{be} + \frac{9}{10}\alpha\sin Lt \quad (5)$$

Thus, it will be appreciated that the voltage across the holding capacitor 9 expressed by the equation (5) does not include any pilot signal component.

Since the voltage across the holding capacitor 9 does not include any pilot signal component, if and when the holding capacitor 9 cooperates with the attenuating circuit 15 to hold the voltage value immediately before the gate is opened when a pulsive noise occurs, it follows that the holding capacitor 9 assuredly holds the value related with the direct current component and the low frequency signal component irrespective of the pilot signal component.

Now let it be assumed that a pulsive noise occurs and the gate 8 is opened. Referring to FIG. 3(a), a pulsive noise is shown as having occurred at the timing $T_O$. When the pulsive noise occurs the timing $T_O$, the noise detector immediately operates to provide an output therefrom and the monostable multivibrator is responsive to the output to generate a trigger signal of a predetermined time period $T_O \sim T_1$. As a result, the gate 8 is opened for that time period $T_O \sim T_1$. Since the voltage across the holding capacitor 9 is that expressed by the equation (5) and the voltage at the point E is that expressed by the equation (4), it follows that the base electrode of the output transistor 10 is supplied with the sum of the voltages expressed by the equations (4) and (5) for the time period $T_O < T \leq T_1$. Accordingly, the signal waveform at the point C during the time period $T_O < T \leq T_1$ may be that shown in FIG. 3(b) at the time period $T_O < T \leq T_1$, where the pulsive noise has been removed.

The stereo pilot signal continues to exist with a constant amplitude even during the time period when the gate is opened. In other words, the stereo pilot signal exists at the point E as $\beta\sin Pt$, immediately after the gate 8 is opened.

During the time period when the gate 8 is opened, the stereo pilot signal is circulating along the path including the holding capacitor 9, the point B, the base-emitter junction of the output transistor 10, the point C, the amplifier 11, the point D, the attenuator 15 and the point E. More specifically described, the amplifier 11 serves to function as a negative feedback amplifier with respect to the signals other than the stereo pilot signal component, while it serves to selectively amplify the predetermined frequency band of the stereo pilot signal component with a gain of 10. On the other hand, the attenuation factor of the attenuator 15 has been selected to be 1/10. Therefore, assuming that the stereo pilot signal level at the point C is 1, the signal level at the point D is 10 and that at the point E is again 1. Now considering the operation centering on the amplifier 11 with respect to the pilot frequency, then the attenuator 15, the holding capacitor 9, and the base-emitter junction of the output transistor 10 constitutes a positive feedback circuit of the amplifier 11, whereby an oscillation circuit is formed as a whole. As a result, a pseudo stereo pilot signal is obtained with a constant level even during the time period when the gate 8 is opened.

Figure 4:
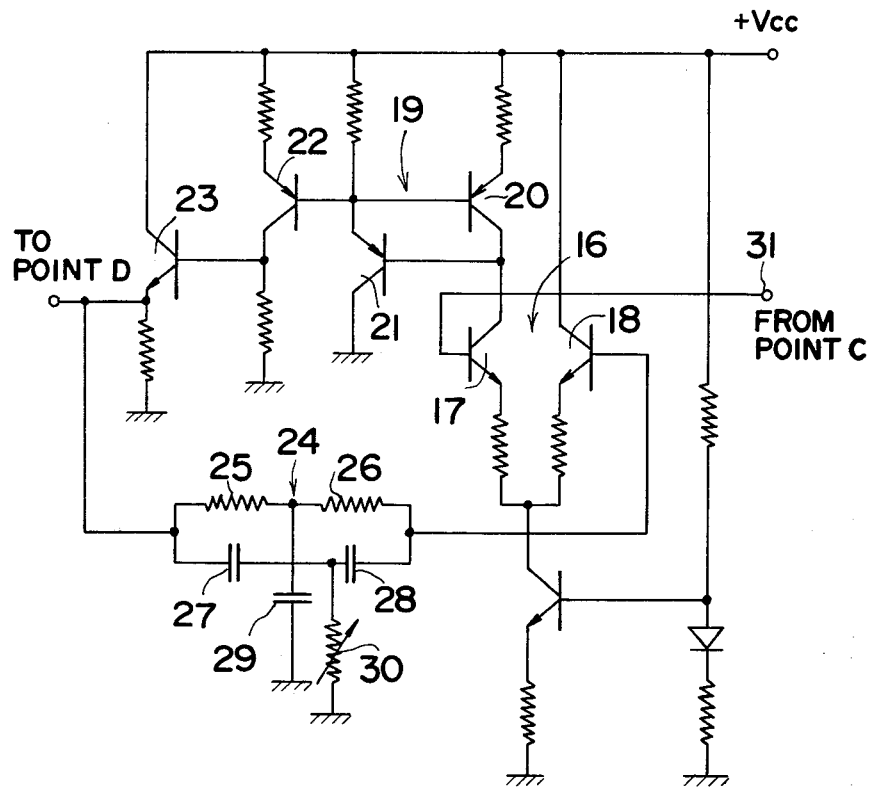
FIG. 4 is a schematic diagram of a portion of the FIG. 2 diagram.

FIG. 4 is a schematic diagram of the amplifier 11 and a frequency band cut off filter 12 shown in FIG. 2, wherein the amplifier 11 has been implemented in an integrated circuit. Referring to FIG. 4, the reference numeral 16 denotes a differential amplifier comprising a pair of transistors 17 and 18 having the emitter electrodes thereof connected to a constant current circuit, the reference numeral 19 denotes a mirror circuit implemented by three transistors 20, 21 and 22, the reference numeral 23 denotes a transistor connected in an emitter follower fashion to form an output stage, the reference numeral 24 denotes a bridge type frequency band cut off filter implemented by resistors 25 and 26, capacitors 27, 28 and 29 and a variable resistor 30, the central frequency of said frequency band cut off filter 24 being set to the stereo pilot signal frequency of 19KHz. The signal applied to the input terminal 31 is amplified by the differential amplifier 16 and is transferred to the emitter electrode of the transistor 23 connected in an emitter follower fashion through the current mirror circuit 19 from the collector of one transistor 17. The current mirror circuit 19 is provided to magnify the dynamic range of the signal. The signal obtained from the emitter electrode of the transistor 23 connected in the emitter follower fashion is negative fedback to the base electrode of the other transistor 18 of the differential amplifier 16 through the frequency band cut off filter 24. Since the cut off central frequency of the frequency band cut off filter 24 has been set to the stereo pilot signal frequency, only the signal components other than the stereo pilot signal component are negative fedback, so that the stereo pilot signal component is selectively amplified with the predetermined gain while the remaining signal components are amplified with the gain of unity. The variable resistor 30 in the frequency band cut off filter 24 is provided to set the cut off frequency to a predetermined value.

In the foregoing, only the stereo pilot signal was considered and description was made of how the pseudo stereo pilot signal component is inserted during the time period when the gate is opened. However, substantially the same problem is encountered with respect to the stereo subcarrier signal component of the central frequency of 38KHz. In particular, in FM stereo broadcasting, assuming that a pulsive noise occurs in case where the right channel signal value and the left channel signal value largely differ, the influence caused by such a noise becomes more serious as compared with the case of the stereo pilot signal. Thus, it is desired or necessary to compensate for a signal associated with the suppression modulated stereo subcarrier signal of the central frequency of 38KHz during the time period when the gate is opened. To that end, the central frequency of the cut off frequency band by the frequency band cut off filter in FIG. 2 may be made consistent with the stereo subcarrier signal frequency, so that the stereo subcarrier associated signal of the same value as the subcarrier associated signal immediately before the gate is opened continues to exist even during the time period when the gate is opened.

Figure 5:
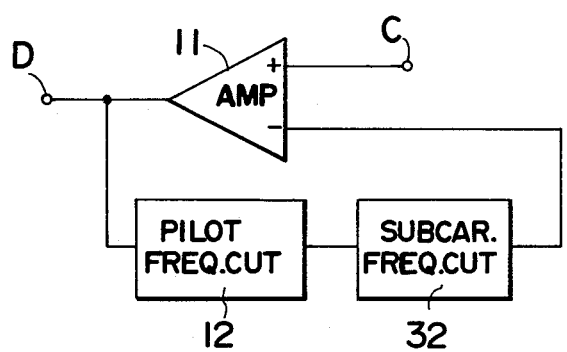
FIG. 5 is a block diagram of another embodiment of the inventive apparatus.

In order to remove the noise more effectively, it is preferred to provide the frequency band cut off filter 12 for cutting off the stereo pilot signal and the frequency band cut off filter 32 for cutting off the stereo subcarrier associated signal are provided in the negative feedback circuit of the amplifier 11, as shown in FIG. 5. The impedance relation between these stages may be properly adjusted at the emitter follower stage of the circuit. In providing two frequency band cut off filters 12 and 32 in the negative feedback circuit of the same amplifier 11, the amplifier can be used commonly to both filters 12 and 32, with the result that the circuit configuration may be made simple and suited for implelemtation in an integrated circuit form.

Although the present invention has been described and illustrated in detail, it is to be clearly understood that the same is by way of illustration and example only and is not to be taken by way of limitation, the spirit and scope of the present invention being limited only by the terms of the appended claims.

What is claimed is:

1. An apparatus for removing noise in a composite signal including an information signal and a reference signal of a predetermined frequency, said apparatus comprising:
   means for providing said composite signal,
   means responsive to said composite signal providing means for detecting a noise signal included in said composite signal,
   means responsive to said noise detecting means for providing an enabling signal of a predetermined time period upon occurence of said noise signal,
   gate means responsive to said composite signal providing means and said enabling signal providing means for being opened when said enabling signal is provided from said enabling signal providing means for interrupting transmission of said composite signal and for being closed when said enabling signal is not provided from said enabling signal providing means for allowing transmission of said composite signal,
   amplifying means coupled to the output of said gate means for selectively amplifying a signal component of a frequency commensurate with said predetermined frequency of said reference signal,
   attenuating means coupled to the output of said amplifying means for attenuating the output from said amplifying means, and
   storing means coupled to the output of said gate means and cooperative with said attenuating means for holding, when said gate means is opened, the signal level at the output of said gate means substantially to the value immediately before said gate means is opened,
   said amplifying means, said attenuating means and said storing means constituting a closed loop, said closed loop forming a positive feedback circuit with respect to said reference signal frequency which serves as an oscillator of said reference signal frequency when said gate means is opened, thereby to provide a pseudo reference signal of said predetermined frequency.

2. An apparatus for removing a noise in a composite signal in accordance with claim 1, wherein said amplifying means comprises
   an amplifier, and
   a negative feedback circuit coupled to said amplifier and having a characteristic for cutting off a signal component of said predetermined frequency.

3. An apparatus for removing a noise in a composite signal in accordance with claim 2, wherein said negative feedback circuit comprises a frequency band cut off filter for cutting off a signal component of said predetermined frequency.

4. An apparatus for removing a noise in a composite signal in accordance with claim 3, wherein said composite signal is an FM stereo signal including an FM stereo pilot signal, and said frequency band cut off filter is set to the frequency of said FM stereo pilot signal.

5. An apparatus for removing a noise in a composite signal in accordance with claim 3, wherein said composite signal is an FM stereo signal including a signal component associated with an FM stereo subcarrier signal, and said frequency band cut off filter is set to the frequency of said FM stereo subcarrier signal.

6. An apparatus for removing a noise in a composite signal in accordance with claim 3, wherein said composite signal is an FM stereo signal including an FM stereo pilot signal and a signal component associated with an FM stereo subcarrier signal, and said frequency band cut off filter is set to the frequencies of said FM stereo pilot signal and said FM stereo subcarrier signal.

* * * * *